350-96.15 SR
E197A XR 3,229,104
TX 350-96.15

Jan. 11, 1966 R. F. RUTZ 3,229,104

FOUR TERMINAL ELECTRO-OPTICAL SEMICONDUCTOR DEVICE USING LIGHT COUPLING

Filed Dec. 24, 1962

INVENTOR
RICHARD F. RUTZ

BY John F. Ahlers... 
ATTORNEY

United States Patent Office 3,229,104

Patented Jan. 11, 1966

3,229,104

FOUR TERMINAL ELECTRO-OPTICAL SEMICONDUCTOR DEVICE USING LIGHT COUPLING

Richard F. Rutz, Cold Spring, N.Y., assignor to International Business Machines Corporation, New York, N.Y., a corporation of New York Filed Dec. 24, 1962, Ser. No. 246,794
13 Claims. (Cl. 250—211)

This invention relates to signal translating devices utilizing semiconductor bodies and in particular to such devices which involve the phenomenon of recombination radiation.

It has previously been discovered that in certain semiconductor materials which are appropriately doped, that is, contain impurities at the proper concentrations, and, with a bias applied to a junction that is formed in these materials, efficient light emission may be obtained due to recombination radiation. For a discussion of the subject, reference may be made to an article by R. J. Keyes and T. M. Quist in the Proceedings of the IRE, vol. 50, page 882 (1962). Additionally, reference may be had to an article in Applied Physics Letters, vol. 1 (November 1962), page 62 by Nathan, Dumke, Burns, Dill and Lasher.

Recombination radiation, as that term is understood in the semiconductor art, refers to a phenomenon where charge carriers, that is, holes and electrons, recombine and produce photons. The recombination process, per se, involves annihilating encounters between the two types of charge carriers within a semiconductor body whereby the carriers effectively disappear. Certain kinds of recombinations have been known to produce radiation but until recently such radiation had been inefficiently produced.

It is a primary object of the present invention to exploit this newly discovered highly efficient recombination radiation phenomenon in a special environment.

Another object is to provide a semiconductor device having a significant electrically insulating region in its construction which allows for ready propagation of photons from one portion of the device to another over comparatively large distances.

The signal translating device of the present invention can be most easily described by using transistor nomenclature since the "black box" description in terms of currents and potentials at the accessible terminals is quite similar to the well-established transistor charactertisics. Thus, reference will be made hereinafter to the conventional terms of emitter, base, and collector, as in the ordinary transistor. However, these terms should not be confused with terms which shall be used later to describe the emission and absorption of photons which occur within the device of the present invention.

Transistors, as they have become known in the past decade or so, have found wide application as signal translating devices such as in amplifiers, oscillators, modulators, etc. The earliest type of transistor was that known as a point contact transistor. More prominently utilized today is the type known as a junction transistor wherein several junctions are defined by contiguous regions within the semiconductor body, which regions vary in conductivity type. Usually this variation is an alternation between what is known as p conductivity type, wherein the majority carriers are holes and a conductivity type wherein the majority carriers are electrons. In general, semiconductor devices have involved injection of carriers into a zone or zones within the semiconductor body. These injected carriers are of a sign opposite those normally present in excess within the zone. Injection is an operating feature of the conventional junction transistor wherein minority carrier injection is controlled in accordance with signals to be translated. Except for the accelerations of carriers through the base region due to the creation of a drift field in certain specialized transistor devices, the movement of carriers is ordinarily solely by diffusion. The injected minority carriers diffuse through the base region over to a collecting junction where they affect the reverse bias current of the collecting junction. Generally speaking, the widths of the base region are required to be smaller than the average diffusion length for the injected minority carriers. This diffusion length is often expressed as $L=\sqrt{D\tau}$ where D is the diffusion constant and $\tau$ is the lifetime of the minority carriers. Also, since the thickness of the base region determines the transit time of injected minority carriers therethrough, for a given diffusion constant, a severe requirement is imposed on the thickness of this region if it is desired to operate at extremely high frequencies.

With the device of the present invention the thickness requirement which is normally imposed, as alluded to above, can be relaxed. The thickness of the intervening region can be on the order of approximately 1 mil or greater in accordance with the absorption coefficient for the particular semiconductor material that is selected. Very pure forms of GaAs have absorption coefficients, usually designated by $k$ as low as 1 cm.$^{-1}$. The absorption distance $D_a$ is the distance at which the amplitude is $1/e$ times its initial amplitude. For the case of $k=1$ cm.$^{-1}$, this is 1 cm., since the absorption varies exponentially as $e^{-kx}$. On the other hand, if a few percent of the As atoms are replaced by P atoms the band gap in the material widens and the $k$ values become substantially lower for the 8400 A. radiation in GaAs at 77° K.

A broad feature of the present invention resides in the provision of a four terminal semiconductor device using light coupling. A more specific feature resides in the provision, within an integral semiconductor body, of an intrinsic or semi-insulating region which is useful as a light pipe or transmission medium between a first light-emitting junction and a second light-receiving junction.

A more specific object of the present invention is to allow for electrical isolation between the input and output terminals of a semiconductor device such that the terminals may ride at arbitrary voltages with either polarity.

The foregoing and other objects, features and advantages of the invention will be apparent from the following more particular description of preferred embodiments of the invention, as illustrated in the accompanying drawings.

Although reference will be made hereinafter to GaAs as a suitable semiconductor material wherein the phenomenon of recombination radiation may be exploited it should be borne in mind that the concept of the present invention is not necessarily limited to this one material and that other suitable materials, especially those in which direct transitions between the valence and conduction bands are possible, may also be utilized.

Figure 1:
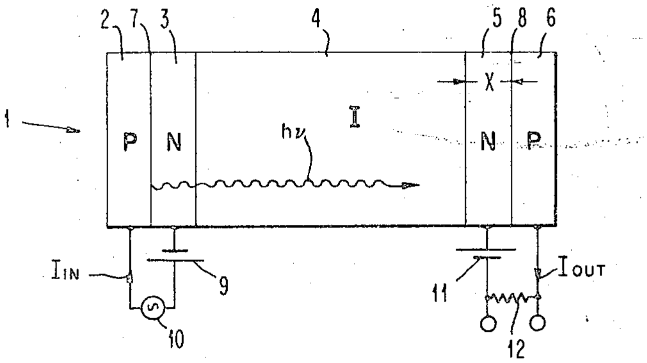
FIGURE 1 is a schematic diagram of a semiconductor device in accordance with the present invention shown connected in a circuit.

Referring now to FIGURE 1 there is shown a four terminal device. The body of the device is generally indicated by reference numeral 1. At one end of the bar or body of semiconductor material there is a p conductivity region 2 and immediately contiguous thereto an n conductivity region 3. An intrinsic or semi-insulating region 4, which is relatively long compared to the pn junction regions 2 and 3, extends to another n conductivity region 5 and immediately contiguous thereto is a p conductivity region 6. In the situation where the bulk of the radiation is expected to be absorbed in the n conductivity region 5, which has a thickness $x$ as shown in FIGURE 1, several criteria apply. One criterion is that the thickness $x$ be greater than $D_a$ where $D_a$ is the absorption distance in the selected n type semiconductor material. A further criterion is that this thickness be less than the average diffusion length L for minority carriers. On the other hand where the bulk of the radiation is expected to be absorbed in the p conductivity region 6 the absorption distance in region 6 must be less than the average diffusion length for minority carriers in this particular region. Of course, in the p region 6 the minority carriers are electrons.

A fixed bias source, shown as a battery 9 in FIGURE 1, is connected to the p and n regions 2 and 3 so as to forward bias the light emitting junction 7. A signal source 10 is imposed on the fixed bias and is applied to the aforesaid regions 2 and 3. Another voltage source 11 is connected to provide a reverse bias of light absorbing pn junction 8 and resistor 12 is connected to this voltage source 11. The signal output is taken across resistor 12, as is conventional. Emission and propagation of photons is schematically shown by the arrow labeled $h\nu$.

In the operation of the device of FIGURE 1, with forward bias imposed on the junction 7, injection of charge carriers occurs. Recombination radiation then takes place within the GaAs body 1 at or near the junction 7. This process is highly efficient and is thought to approach 100% efficiency in the conversion of injection carriers into photons.

It should be emphasized at this juncture that the criterion normally applicable to conventional transistor action is that preference be given at the base-emitter junction to injection of charge carriers into the base region, the injected carriers being minority carriers in the base region. It is these minority carriers that should constitute the major contribution to current flow in the input circuit. However, in the case of the present invention this criterion does not necessarily apply since what one wants is highly efficient emission of photons at or near the junction 7. It is this emission of photons, rather than injection of charge carriers into a base region, which is of prime importance and which determines the efficiency of operation of the device of the present invention.

The photons of radiation $h\nu$ which travel across the relatively thick intrinsic or semi-insulating region 4 are absorbed upon striking the reverse biased pn junction 8 and are thereupon converted into charge carriers. Due to this conversion into charge carriers there is an increase of current in the output circuit as indicated by the arrow labeled $I_{out}$.

The efficiency of the process of emitting light at input junction 7 and of collecting the emitted light at output junction 8 may be expressed as $\eta_0=\eta_1\eta_2\eta_3$ where $\eta_1$ is the efficiency of the recombination radiation due to the injection of charge carriers at or near the input junction, $\eta_2$ is the efficiency of a transport of photons which propagate through the intrinsic region 4 and $\eta_3$ is the efficiency of the absorption of photons and their consequent conversion to output current. Overall efficiency on the order of at least 20% may be obtained for $\eta_0$.

The structure of FIGURE 1 may be obtained by the following preferred technique: A GaAs wafer is initially selected to be of intrinsic or semi-insulating character having a resistivity on the order of $10^8$ ohms/centimeter. The wafer typically would have a thickness on the order of 15 mils. By a technique such as vapor growth the thin layers of n conductivity type, that is layers 3 and 5 in FIGURE 1, are each constructed with a thickness typically on the order of 2 mils.

In the case now under discussion involving the construction of a semiconductor structure constituted solely of GaAs, the p type region 6 will be more absorbing than the n type region 5 and hence the last noted criterion above for the thickness of this region is applicable, that is, the p type region 6 must have an absorption distance less than the average diffusion length for electrons. However, it should be borne in mind that there is a fixed overall length for the material in order to prevent excessive amounts of absorption and thus there is a limitation which is also imposed on the n type region if it is desired to keep the intrinsic region 4 as long as possible.

Thereafter, by a diffusion step, the layers 2 and 6 are created by conversion of a portion of the original n conductivity layers to p conductivity. Typically the n conductivity layers would have an impurity concentration on the order of $4\times 10^{17}$ a./cc. and the p conductivity layers 2 and 6 would have an impurity concentration on the order of $4\times10^{17}$ a./cc. at the junction, to $5\times10^{19}$ a./cc. at the surface. Rather than separate steps involving both vapor growth and diffusion, it will be understood that the separate p and n conductivity regions could be created by successive diffusion operations. It will also be understood that the p and n conductivity layers in FIGURE 1 can be interchanged, that is, the layer 2 can be of n conductivity type and the layer 3 of n conductivity type, since the device of the present invention is not dependent upon minority carrier diffusion. Likewise, the conductivity of layers 5 and 6 may be interchanged. If it is desired, epitaxially compatible semiconductor materials may be successfully employed, whereby, for example, the collecting portion of the structure of FIGURE 1 may be constructed of Ge vapor grown on the intrinsic region 4 of GaAs.

Figure 2:
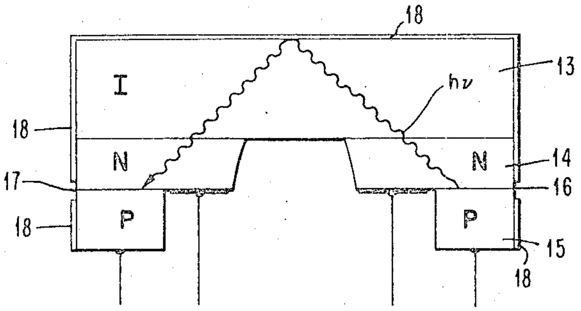
FIGURE 2 illustrates a special geometry for the device of FIGURE 1.

Referring now to FIGURE 2 there is illustrated a special geometry which provides the same essential operating features as the device embodied in FIGURE 1. However, in the fabrication of the structural configuration shown in FIGURE 2 a semi-insulating wafer 13 has built upon it the opposite conductivity layers 14 and 15. Thereafter portions of the layers 14 and 15 are separated, typically by etching, so as to delimit individual junctions 16 and 17, the junction 16 serving as the light emitting junction and junction 17 as the light collecting junction. The photons of radiation which are emitted at or near junction 16 are propagated into the semi-insulating region 13 and a substantial portion of the propagated light is reflected back from a surface coating 18 provided on the outside of region 13. The device operation described is obtained by simple application of the appropriate input and output biases discussed heretofore in connection with the embodiment of FIGURE 1. The semi-insulating region 13, of course, provides the same isolation as heretofore between the input and output circuits. By conventional means ohmic contacts are made to the separated portions of the layers 14 and 15.

Figure 3:
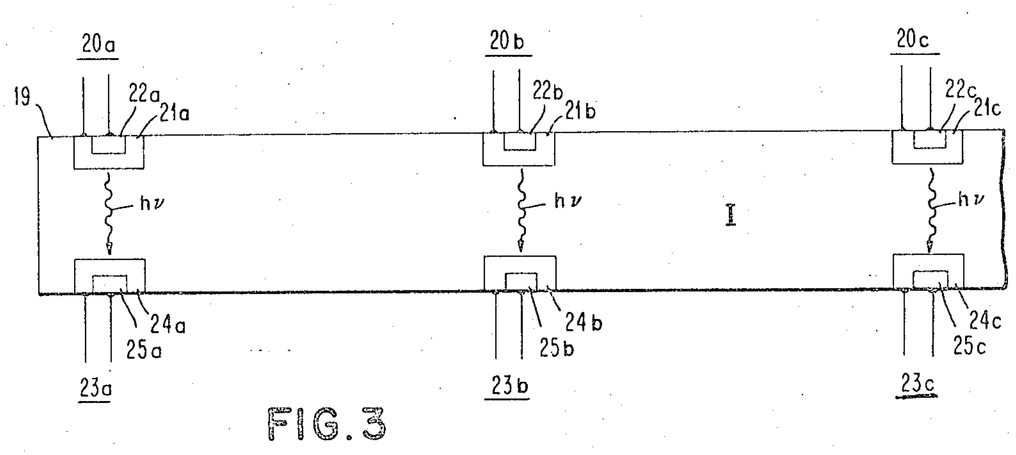
FIGURE 3 illustrates a portion of an array of devices according to the present invention.

Referring now to FIGURE 3 there is illustrated a portion of an array of devices in a matrix. An intrinsic or semi-insulating block 19 is used for the matrix. Typically, this block would have a resistivity on the order of $10^8$ ohm-cm. On one surface of the body 19 a plurality of discrete junctions 20*a*, 20*b* and 20*c*, and on another surface a further plurality, 23*a*, 23*b* and 23*c*, are created. Three separate devices, each constituted of an input and an output junction, are thus produced. In a typical one of the input junctions, for example, 20*a*, one region thereof, 21*a*, is of a first predetermined conductivity type and the region 22*a* is of the opposite conductivity type. Likewise, a typical one of the output junction elements, junction element 23*a*, is constituted of two regions 24*a* and 25*a* of opposite conductivity type.

The plurality of input junctions 20*a*, 20*b* and 20*c*, and the corresponding plurality of output junctions 23*a*, 23*b* and 23*c* have connections so made to them, and have appropriate biases so applied to them, that they operate in the manner described for the input junction 7 and the output junction 8 of FIGURE 1. The spacing between the individual input and output junctions is such that there will be no cross-talk between the respective devices. Thus the spacing between a given input junction element and output junction element for one device is much less than the spacing from device to device, as clearly indicated in FIGURE 3.

Due to their special characteristics, upon occurrence of the injection of charge carriers, these input junctions produce photon radiation and it is this photon radiation that serves to couple the input junctions *20a*, *20b* and *20c* with the respective output junctions *23a*, *23b* and *23c*. Thus there is provided in the array of FIGURE 3 a very simple and advantageous means for communicating between input junction elements and their corresponding output junction elements. These techniques are valuable for integrated circuit structures, where for speed, reliability, compactness and cost reasons, closely packed elements are desired since both sides of supporting and electrically isolating wafers may be readily used.

Any one of a number of techniques may actually be employed to provide the input and output junction in the array of FIGURE 3. A preferred technique is by diffusion of an impurity vapor into the intrinsic body 19 to create initially the regions, for example, *21a* and *24a*. Then by an additional diffusion step the regions *22a* and *25a* are realized.

What has been described is a unique four terminal device employing photon radiation as the coupling or transmission medium between input and output elements, as well as a technique for producing such a four terminal device or a plurality of such devices in a matrical array. The present invention allows for electrical isolation between the input and output terminals of the semiconductor device and further permits relatively thick separation (as much as 15 mils for GaAs) between the input and output elements due to the operating features of radiation coupling.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A radiation coupled semiconductor device comprising an integral crystalline body of a semiconductor material having a plurality of regions of different conductivity type,
   - the principal part of said body being composed of a semi-insulating material,
   - two spaced junctions within said integral body, the first of said junctions being operable to produce recombination radiation due to injection of charge carriers and the second of said junctions being operable for absorbing radiation,
   - said first junction having a region in contiguity with said semi-insulating material and said second junction having a region in contiguity with said semi-insulating material,
   - means for biasing said first junction so as to inject charge carriers thereby to produce recombination radiation at said first junction, which radiation propagates through said semi-insulating material, and
   - means for biasing said second junction to collect the charge carriers which are generated due to the absorption of the propagated radiation at said second junction.

2. A radiation coupled semiconductor device comprising an integral crystalline body of semiconductor material, having at least five regions of different conductivity,
   - a first, intermediate, region of intrinsic conductivity and semi-insulating,
   - a first pair of regions of opposite conductivity type at one end of said first, intermediate, region defining a radiation emitting junction,
   - a second pair of regions at the other end of said intermediate region, defining a radiation absorbing junction,
   - electrical contacts to said pairs of regions,
   - means, connected to said first junction, for biasing said first junction so as to inject charge carriers thereby to produce recombination radiation at said first junction and, consequently, the propagation of said radiation through said first, intermediate, region of intrinsic conductivity, and
   - means, connected to said second junction, for biasing said second junction to collect the charge carriers generated due to the absorption of said radiation at said second junction.

3. A radiation coupled semiconductor device comprising an integral crystalline body of semiconductor material, having at least five regions of different conductivity,
   - a first, intermediate, region of intrinsic conductivity and semi-insulating, said region having a thickness at least several times greater than the diffusion length of minority carriers, therein,
   - two contiguous regions of opposite conductivity type at either end of said first, intrinsic, region,
   - the first two of said regions defining a radiation emitting junction,
   - the other two of said regions defining a radiation absorbing junction,
   - electrical contacts to each of said contiguous regions,
   - means, connected to said first junction, for biasing said first junction so as to inject charge carriers thereby to produce propagation of said radiation through said first region of intrinsic conductivity, and
   - means connected to said second junction for biasing said second junction to collect the charge carriers generated due to the absorption of said radiation at said second junction.

4. A radiation coupled semiconductor device comprising an integral crystalline body of semiconductor material, having at least five regions of different conductivity,
   - a first, intermediate, region of intrinsic conductivity and semi-insulating, having a thickness of approximately 15 mils,
   - two contiguous regions of opposite conductivity type at either end of said first, intrinsic, region,
   - the first two of said regions defining a radiation emitting junction,
   - the other two of said regions defining a radiation absorbing junction,
   - electrical contacts to each of said contiguous regions,
   - means, connected to said first junction, for biasing said first junction so as to inject charge carriers thereby to produce recombination radiation at said first junction and to produce propagation of said radiation through said first region of intrinsic conductivity, and
   - means, connected to said second junction, for biasing said second junction to collect the charge carriers generated due to the absorption of said radiation at said second junction.

5. The invention as defined in claim 3 wherein the integral crystalline body is composed of GaAs.

6. A radiation coupled semiconductor device comprising an integral crystalline body of semiconductor material, having at least five regions of different conductivity,
   - a first, intermediate, region of intrinsic conductivity,
   - two regions of opposite conductivity type at either end of said first intrinsic region, defining, respectively, two spaced p-n junctions,
   - a first pair of said regions defining a radiation emitting junction,
   - the second pair of said regions defining a radiation absorbing junction,
   - electrical contacts to said pairs of regions,
   - means, connected to said first junction, for biasing said first junction so as to inject charge carriers thereby to produce recombination radiation at said first junction and to produce propagation of said radiation through said first region of intrinsic conductivity, and
means, connected to said second junction, for biasing said second junction to collect the charge carriers generated due to the absorption of said radiation at said second junction.

7. A radiation coupled semiconductor device comprising an integral crystalline body of semiconductor material, having at least five regions of different conductivity,
a first, intermediate, region of intrinsic conductivity, two regions at either end of said first intrinsic region,
a first pair of said regions defining a radiation emitting junction, the second pair of said regions defining a radiation absorbing junction,
electrical contacts to said pairs of regions,
means, connected to said first junction, for forward biasing said first junction so as to inject charge carriers thereby to produce recombination radiation at said first junction and to produce propagation of said radiation through said first region of intrinsic conductivity, and
means, connected to said second junction, for reverse biasing said second junction to collect the charge carriers generated due to the absorption of said radiation at said second junction.

8. A radiation coupled semiconductor device comprising an integral crystalline body composed of a single semiconductor material and having a succession of first, second, third, fourth and fifth regions,
said first and fifth regions being of p conductivity type, said second and fourth regions being of n conductivity type, and said third region being of intrinsic conductivity,
said first and second regions defining a first p–n junction, said first junction being operable to produce recombination radiation due to injection of charge carriers,
said fourth and fifth regions defining a second p–n junction operable for absorbing radiation,
means for forward biasing said first junction so as to inject charge carriers thereby to produce recombination radiation at said first junction, and
means for reverse biasing said second junction so as to collect the charge carriers which are generated due to absorption of radiation at said second junction.

9. The radiation coupled semiconductor device as defined in claim 8 wherein said single semiconductor material is GaAs.

10. A radiation coupled semiconductor structure comprising an integral crystalline body, having successive zones of p conductivity type, n conductivity type and intrinsic conductivity,
first and second junctions defined and delimited in a single junction plane within said integral body, said first junction serving as a radiation emitting junction and said second as a radiation absorbing junction,
means, connected to said first junction, for biasing said first junction so as to inject charge carriers thereby to produce recombination radiation at said first junction and, consequently, the propagation of said radiation through said first, intermediate, region of intrinsic conductivity, and
means, connected to said second junction, for biasing said second junction to collect the charge carriers generated due to the absorption of said radiation at said second junction,
coating means surrounding said integral crystalline body for retaining the radiation within said body.

11. An integral array of radiation coupled semiconductor devices comprising a semiconductor body of semi-insulating material,
a first plurality of junctions, each defined by separate regions of opposite conductivity type formed on one surface of said semiconductor body,
a second corresponding plurality of junctions, each defined by separate regions of opposite conductivity type formed on another surface of said semiconductor body,
means for biasing said first plurality of junctions so as to inject charge carriers thereby to produce recombination radiation at said first junctions, and
means for biasing said second plurality of junctions to collect the charge carriers which are generated due to the absorption of radiation propagated from each of said respective first junctions through said semi-insulating body.

12. An integral array of radiation coupled semiconductor devices comprising a semiconductor matrix of semi-insulating material,
a first plurality of junctions, each defined by separate regions of opposite conductivity type formed on one surface of said semiconductor body,
a second corresponding plurality of junctions, each defined by separate regions of opposite conductivity type formed on another surface of said semiconductor body,
means for forward biasing said first plurality of junctions so as to inject charge carriers thereby to produce recombination radiation at said first junctions, and
means for reverse biasing said second plurality of junctions to collect the charge carriers which are generated due to the absorption of radiation propagated from each of said respective first junction through said semi-insulating matrix.

13. An integral array of radiation coupled semiconductor devices as defined in claim 12 wherein the semi-insulating matrix is GaAs having a resistivity on the order of $10^8$ ohm-cm.

References Cited by the Examiner

UNITED STATES PATENTS

| | | | |
|---|---|---|---|
| 2,790,037 | 4/1957 | Shockley | 317—235 |
| 3,043,958 | 7/1962 | Diemer | 317—235 |
| 3,043,959 | 7/1962 | Diemer | 317—235 |

RALPH G. NILSON, *Primary Examiner.*

WALTER STOLWEIN, *Examiner.*